United States Patent
Seo et al.

(10) Patent No.: US 8,003,230 B2
(45) Date of Patent: Aug. 23, 2011

(54) ELECTROLUMINESCENT ELEMENT

(75) Inventors: Satoshi Seo, Kanagawa (JP); Hiroko Abe, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/754,973

(22) Filed: Apr. 6, 2010

(65) Prior Publication Data

US 2010/0194266 A1 Aug. 5, 2010

Related U.S. Application Data

(63) Continuation of application No. 10/801,113, filed on Mar. 16, 2004, now Pat. No. 7,695,828.

(30) Foreign Application Priority Data

Mar. 20, 2003 (JP) .................................. 2003-077875

(51) Int. Cl.
*H01L 51/54* (2006.01)

(52) U.S. Cl. ......... 428/690; 428/917; 313/504; 313/506

(58) Field of Classification Search .................. None
See application file for complete search history.

(56) References Cited

U.S. PATENT DOCUMENTS

| | | | |
|---|---|---|---|
| 5,281,489 A | 1/1994 | Mori et al. | |
| 5,645,948 A | 7/1997 | Shi et al. | |
| 5,766,779 A | 6/1998 | Shi et al. | |
| 5,929,561 A | 7/1999 | Kawami et al. | |
| 6,171,715 B1 | 1/2001 | Sato et al. | |
| 6,461,747 B1 | 10/2002 | Okada et al. | |
| 6,656,612 B2 | 12/2003 | Okada et al. | |
| 6,830,836 B2 | 12/2004 | Okada et al. | |
| 6,876,684 B2 | 4/2005 | Kahen et al. | |
| 7,201,974 B2 * | 4/2007 | Hamada | 428/690 |
| 7,282,275 B2 * | 10/2007 | Wolk et al. | 428/690 |
| 7,695,828 B2 * | 4/2010 | Seo et al. | 428/690 |

(Continued)

FOREIGN PATENT DOCUMENTS

EP 0825803 B1 2/1998

(Continued)

*Primary Examiner* — Dawn Garrett
(74) *Attorney, Agent, or Firm* — Fish & Richardson P.C.

(57) ABSTRACT

An electroluminescent element includes host materials and guest materials in a part of an electroluminescent layer. Device characteristics (luminous efficiency, luminous characteristics, or the like) of the electroluminescent element is improved by using host materials and guest materials with a common skeleton (represented by the following general formula 14) for an electroluminescent layer interposed between a pair of electrodes in the electroluminescent element.

(14)

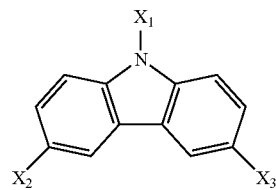

In general formula 14, $X_1$ to $X_3$, each of which may be the same or different, are individually a hydrogen atom, a halogen atom, a lower alkyl group, an alkoxy group, an acyl group, a nitro group, a cyano group, an amino group, a dialkylamino group, a diarylamino group, a vinyl group which may have a substituent, an aryl group which may have a substituent, or a heterocyclic group which may have a substituent.

2 Claims, 10 Drawing Sheets

U.S. PATENT DOCUMENTS

| | | |
|---|---|---|
| 2002/0055014 A1 | 5/2002 | Okada et al. |
| 2003/0127656 A1 | 7/2003 | Aizawa et al. |
| 2003/0127974 A1 | 7/2003 | Miyazawa |
| 2003/0157365 A1* | 8/2003 | Kinoshita et al. ............ 428/690 |
| 2003/0170493 A1 | 9/2003 | Chen et al. |
| 2003/0186081 A1* | 10/2003 | Sotoyama et al. ............ 428/690 |
| 2003/0215667 A1 | 11/2003 | Xie |
| 2003/0219625 A1* | 11/2003 | Wolk et al. .................... 428/690 |
| 2004/0062947 A1 | 4/2004 | Lamansky et al. |
| 2005/0260413 A1 | 11/2005 | Tateishi et al. |

FOREIGN PATENT DOCUMENTS

| | | |
|---|---|---|
| JP | 04002096 B2 | 1/1992 |
| JP | 10106749 A | 4/1998 |
| JP | 2001076876 A | 3/2001 |
| JP | 2001118683 A | 4/2001 |
| JP | 2001335776 A | 12/2001 |
| JP | 2003282267 A | 10/2003 |

* cited by examiner

ELECTROLUMINESCENT ELEMENT

CROSS-REFERENCE TO RELATED APPLICATIONS

This application is a continuation of U.S. application Ser. No. 10/801,113, filed Mar. 16, 2004, now U.S. Pat. No. 7,695, 828, which claims the benefit of a foreign priority application filed in Japan as Ser. No. 2003-077875 on Mar. 20, 2003, both of which are incorporated by reference.

BACKGROUND OF THE INVENTION

1. Field of the Invention

The present invention relates to an electroluminescent element. More specifically, the invention relates to an electroluminescent element having an electroluminescent layer, a part of which comprises host materials and guest materials.

2. Related Art

An electroluminescent element comprises an electroluminescent layer interposed between a pair of electrodes (anode and cathode). The emission mechanism is as follows. Upon applying voltage through a pair of electrodes, holes injected from an anode and electrons injected from a cathode are recombined with each other within the electroluminescent layer to lead the formation of molecular excitons, and the molecular excitons return to the ground state while radiating energy to emit photon. There are two excited states possible from organic compounds, a singlet state and a triplet state. It is considered that light emission can be obtained through both the singlet state and the triplet state.

Although an electroluminescent layer may have a single layer structure comprising only a light-emitting layer formed by a light-emitting material, the electroluminescent layer is formed to have not only a single layer structure comprising only a light-emitting layer but also a lamination layer structure comprising a hole injecting layer, a hole transporting layer, a hole blocking layer, an electron transporting layer, an electron injecting layer, and the like which are formed by a plurality of functional material. Color tone can be appropriately changed by doping guest materials into host materials in the light-emitting layer. There is some possibility of improving luminance and lifetime of light emission in some combination of the host material and the guest material.

It has been disclosed that the quantum efficiency or the durability is improved of an electroluminescent element comprising host materials and guest materials, for example, tris (8-hydroxyquinoline)aluminum (also referred to as $Alq_3$) as host materials and a coumarin derivative as guest materials. (For example, reference 1: Unexamined Patent Publication 2001-76876.)

In addition, it has been disclosed that an electroluminescent element comprising host materials and guest materials which is superior in luminous efficiency, durability, color purity characteristics, and the like to those of the conventional electroluminescent element can be provided by selecting host materials having the peak intensity of emission spectrum in a certain range. (For example, reference 2: Unexamined Patent Publication 2001-118683.)

However, such electroluminescent element has been practically insufficient yet in terms of luminous efficiency or luminous characteristics. It is desired to develop an electroluminescent element having further superior device characteristics.

SUMMARY OF THE INVENTION

In view of the foregoing, it is an object of the present invention to provide an electroluminescent element having an electroluminescent layer, a part of which comprises host materials and guest materials, and being superior in device characteristics such as luminous efficiency and luminous characteristics to those of the conventional electroluminescent element.

The inventor discovers that the carrier transportation between host materials and guest materials can be improved by using host materials and guest materials which have a skeleton common to each other for an electroluminescent element.

According to the present invention, device characteristics (luminous efficiency, luminous characteristics, or the like) of an electroluminescent element is improved by using host materials and guest materials which have a skeleton common to each other for an electroluminescent layer between a pair of electrodes of the electroluminescent element.

Therefore, an electroluminescent element according to the invention comprises between a pair of electrodes host materials and guest materials which have in their molecules a common skeleton represented by the following general formula (1), (9), and (14).

Formula 15

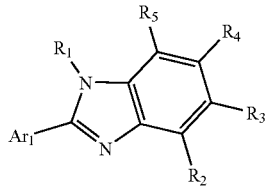

(1)

wherein R1 is a hydrogen atom, a lower alkyl group, an aryl group which may have a substituent, or a heterocyclic group which may have a substituent, R2 to R5, each of which may be the same or different, are individually a hydrogen atom, a halogen atom, a lower alkyl group, an alkoxy group, an acyl group, a nitro group, a cyano group, an amino group, a dialkylamino group, a diarylamino group, a vinyl group which may have a substituent, an aryl group which may have a substituent, or a heterocyclic group which may have a substituent, and Ar1 is an aryl group which may have a substituent, or a heterocyclic group which may have a substituent.

Formula 16

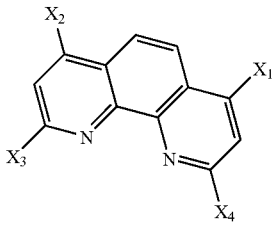

(9)

wherein X1 to X4, each of which may be the same or different, are individually a hydrogen atom, a halogen atom, a lower alkyl group, an alkoxy group, an acyl group, a nitro group, a cyano group, an amino group, a dialkylamino group, a diarylamino group, a vinyl group which may have a substituent, an aryl group which may have a substituent, or a heterocyclic group which may have a substituent.

Formula 17

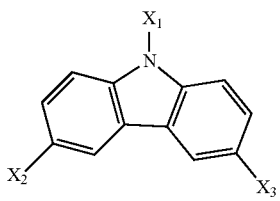
(14)

wherein X1 to X3, each of which may be the same or different, are individually a hydrogen atom, a halogen atom, a lower alkyl group, an alkoxy group, an acyl group, a nitro group, a cyano group, an amino group, a dialkylamino group, a diarylamino group, a vinyl group which may have a substituent, an aryl group which may have a substituent, or a heterocyclic group which may have a substituent.

BRIEF DESCRIPTION OF THE INVENTION

DESCRIPTION OF THE INVENTION

Figure 1:
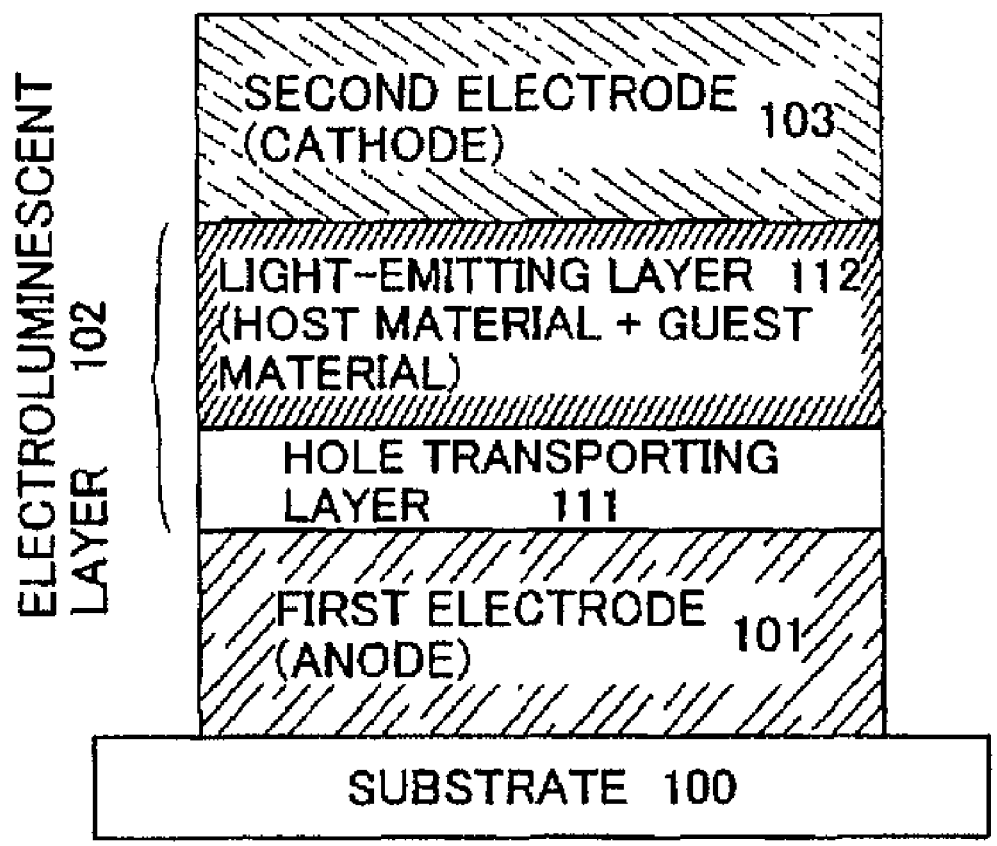
FIG. 1 is an explanatory view for showing a device configuration of an electroluminescent element according to Embodiment 1.

An electroluminescent element according to the present invention has the device configuration that an electroluminescent layer comprising a hole transporting layer and a light-emitting layer is interposed between a pair of electrodes (an anode and a cathode). The light-emitting layer contains host materials and guest materials which have a common skeleton represented by general formulas (1), (9), and (14).

Formula 18

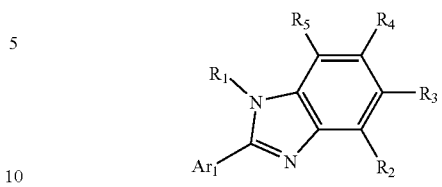
(1)

wherein R1 is a hydrogen atom, a lower alkyl group, an aryl group which may have a substituent, or a heterocyclic group which may have a substituent, R2 to R5, each of which may be the same or different, are individually a hydrogen atom, a halogen atom, a lower alkyl group, an alkoxy group, an acyl group, a nitro group, a cyano group, an amino group, a dialkylamino group, a diarylamino group, a vinyl group which may have a substituent, an aryl group which may have a substituent, or a heterocyclic group which may have a substituent, and Ar1 is an aryl group which may have a substituent, or a heterocyclic group which may have a substituent.

In the invention, in case of using a compound which has an imidazole skeleton represented by general formula (1) in a part of the molecular structure for a light-emitting layer, both the host material and guest materials contained in the light-emitting layer are compounds having the imidazole skeleton. Specifically, host materials have a benzene ring represented by general formula (2) as a main skeleton, guest materials have a coumarin skeleton represented by general formula (3) as a main skeleton, at least one substituent out of substituents X1 to X6 in the host material represented by general formula (2) and a substituent X1 in the guest material represented by general formula (3) have an imidazole skeleton represented by general formula (4).

Formula 19

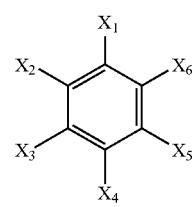
(2)

Formula 20

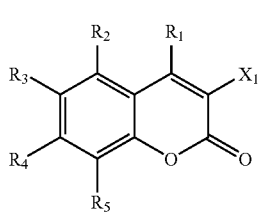
(3)

wherein R1 is a hydrogen atom, a lower alkyl group, an aryl group which may have a substituent, or a heterocyclic group which may have a substituent, and R2 to R5, each of which may be the same or different, are individually a hydrogen atom, a halogen atom, a lower alkyl group, an alkoxy group, an acyl group, a nitro group, a cyano group, an amino group, a dialkylamino group, a diarylamino group, a vinyl group which may have a substituent, an aryl group which may have a substituent, or a heterocyclic group which may have a substituent.

Formula 21

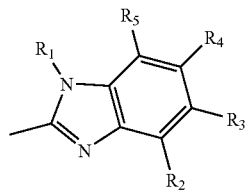

(4)

wherein R1 is a hydrogen atom, a lower alkyl group, an aryl group which may have a substituent, or a heterocyclic group, and R2 to R5, each of which may be the same or different, are individually a hydrogen atom, a halogen atom, a lower alkyl group, an alkoxy group, an acyl group, a nitro group, a cyano group, an amino group, a dialkylamino group, a diarylamino group, a vinyl group which may have a substituent, an aryl group which may have a substituent, or a heterocyclic group which may have a substituent.

Formula 22

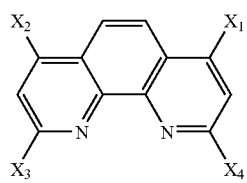

(9)

wherein X1 to X4, each of which may be the same or different, are individually a hydrogen atom, a halogen atom, a lower alkyl group, an alkoxy group, an acyl group, a nitro group, a cyano group, an amino group, a dialkylamino group, a diarylamino group, a vinyl group which may have a substituent, an aryl group which may have a substituent, or a heterocyclic group which may have a substituent.

In the invention, in case of using a compound, which has the structure represented by general formula (9) in a part of the molecular structure, for a light-emitting layer, both the host material and the guest material are compounds (phenanthroline derivatives) having the structure represented by the general formula (9). Specifically, the host material is a compound represented by general formula (10) and the guest material is a compound represented by the general formula (11).

Formula 23

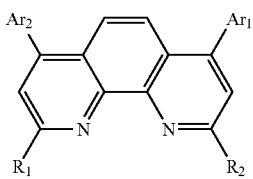

(10)

wherein Ar1 and Ar2, each of which may be the same or different, are individually an aryl group which may have a substituent, or a heterocyclic group, and R1 and R2, each of which may be the same or different, are individually a hydrogen atom, a halogen atom, a lower alkyl group, an alkoxy group, an acyl group, a nitro group, a cyano group, an amino group, a dialkylamino group, a diarylamino group, a vinyl group which may have a substituent, an aryl group which may have a substituent, or a heterocyclic group which may have a substituent.

Formula 24

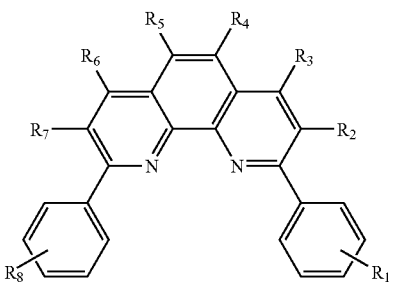

(11)

wherein R1 to R8, each of which may be the same or different, are individually a hydrogen atom, a halogen atom, a lower alkyl group, an alkoxy group, an acyl group, a nitro group, a cyano group, an amino group, a dialkylamino group, a diarylamino group, a vinyl group which may have a substituent, an aryl group which may have a substituent, or a heterocyclic group which may have a substituent.

Formula 25

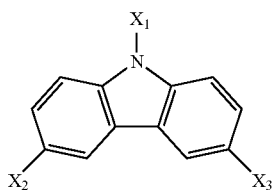

(14)

wherein X1 to X3, each of which may be the same or different, are individually a hydrogen atom, a halogen atom, a lower alkyl group, an alkoxy group, an acyl group, a nitro group, a cyano group, an amino group, a dialkylamino group, a diarylamino group, a vinyl group which may have a substituent, an aryl group which may have a substituent, or a heterocyclic group which may have a substituent.

In the invention, in case of using a compound which has the structure represented by general formula 14 in a part of the molecular structure for a light-emitting layer, both the host material and the guest material are compounds (carbazole derivatives) having the structure represented by the general formula (14).

As a lower alkyl group represented by general formulas (1) to (4), (9) to (11), and (14), a methyl group, an ethyl group, an n-propyl group, an isopropyl group, an n-butyl group, a sec-butyl group, a tert-butyl group, a hexyl group, and the like are nominated, and those of which have preferably carbon atoms of from 1 to 6. An alkyl halide group such as a trifluoromethyl group, or a cycloalkyl group such as a cyclohexyl group may be used.

As an alkoxy group, a methoxy group, an ethoxy group, an n-propoxy group, an isopropoxy group, an n-butoxy group, a sec-butoxy group, a tert-butoxy group, a hexoxy group, and the like are nominated, and those of which have preferably carbon atoms of from 1 to 6. As an acyl group, an acetyl group is nominated.

As a dialkylamino group, a dimethylamino group, a diethylamino group, and the like are nominated, and those of which have preferably carbon atoms of from 1 to 4. As a diarylamino group, a diphenylamino group, a bis(α-naphtyl)amino group are nominated. Alternatively, a substituted arylamino group such as bis(m-tolyl)amino group may be used.

As a vinyl group, a vinyl group having a substituent such as diphenylvinyl group may be used. As an aryl group, besides a nonsubstituted aryl group such as a phenyl group or a naphthyl group, a substituted aryl group such as an o-tolyl group, an m-tolyl group, a p-tolyl group, a xylyl group, a methoxyphenyl group, an ethoxyphenyl group, a fluorophenyl group may be used. In addition, as a heterocyclic group, a pyridyl group, a furyl group, a thienyl group, and the like are nominated.

Further, a known material can be used for an electroluminescent layer according to the invention except a light-emitting layer comprising host materials and guest materials which have a skeleton common to each other. Either a small molecular material or a high molecular material can be used. Moreover, the material is composed of not only an organic compound material but also an inorganic compound.

According to the invention, within an electroluminescent element having the configuration: anode/light-emitting layer/cathode, anode/hole transporting layer/light-emitting layer/cathode, anode/hole transporting layer/light-emitting layer/electron transporting layer/cathode, anode/hole injecting layer/hole transporting layer/light-emitting layer/electron transporting layer/cathode, anode/hole injecting layer/hole transporting layer/light-emitting layer/electron transporting layer/electron injecting layer/cathode, anode/hole injecting layer/hole transporting layer/light-emitting layer/hole blocking layer/electron transporting layer/cathode, anode/hole injecting layer/hole transporting layer/light-emitting layer/hole blocking layer/electron transporting layer/electron injecting layer/cathode, or the like, a light-emitting layer is formed by host materials and guest materials which have a skeleton common to each other.

Hereinafter, embodiments of the invention will be explained in detail.

Embodiment 1

In Embodiment 1, the device configuration of an electroluminescent element will be explained with reference to FIG. 1 in case of forming a light-emitting layer by host materials and guest materials which have a skeleton common to each other.

As shown in FIG. 1, an electroluminescent element has the structure comprising a substrate 100, a first electrode 101, an electroluminescent layer 102, and a second electrode 103, sequentially.

As a material for the substrate 100, any material that is used for the conventional substrate can be used. For instance, a substrate formed by glass, quartz, transparent plastic, or the like can be used.

The first electrode 101 serves as an anode, and the second electrode 103 serves as a cathode in Embodiment 1.

Therefore, the first electrode 101 is formed by an anode material. As an anode material, metals having a large work function (at least 4.0 eV), alloys, compounds having electrical conduction properties, and mixture of these materials can be preferably used. As specific examples of the anode materials, besides ITO (indium tin oxide) or IZO (indium zinc oxide) composed of indium oxide mixed with zinc oxide (ZnO) of from 2 to 20%, aurum (Au), platinum (Pt), nickel (Ni), tungsten (W), chrome (Cr), molybdenum (Mo), ferrum (Fe), cobalt (Co), copper (Cu), palladium (Pd), nitride of metal material (TiN), or the like can be used.

On the other hand, as a cathode material for forming the second electrode 103, metals having a small work function (at most 3.8 eV), alloys, compounds having electrical conduction properties, and mixture of these materials can be preferably used. As specific examples of the cathode materials, a transition metal containing a rare earth metal can be used, besides an element in the first or second periodic row, that is, an alkaline metal such as Li, Cs, or the like, alkaline earth metal such as Mg, Ca, Sr, or the like, alloys of these elements (Mg:Ag, Al:Li), or compounds (LiF, CsF, $CaF_2$). Alternatively, the second electrode 103 can be formed by a lamination layer of the transition metal and metals such as Al, Ag, or ITO (including alloys).

The above anode and cathode materials are deposited by vapor deposition or sputtering to form the first electrode 101 and the second electrode 103. The electrodes are preferably formed to have a thickness of from 10 to 500 nm.

An electroluminescent element according to the invention has the structure that light generated by recombination of carries within an electroluminescent layer emits from either the first electrode 101 or the second electrode 103, or both electrodes. When light emits from the first electrode 101, the first electrode 101 is formed by a material having light transmission properties. When light emits from the second electrode 103, the second electrode 103 is formed by a material having light transmission properties.

The electroluminescent layer 102 is formed by stacking a plurality of layers. In Embodiment 1, the electroluminescent layer 102 is formed by stacking a hole transporting layer 111 and a light-emitting layer 112.

In this case, as a hole transportation material for forming the hole transporting layer 111, aromatic amine (that is, the one having a benzene ring-nitrogen bond) compounds are preferably used. For example, besides the above mentioned TPD, derivatives thereof such as 4,4'-bis[N-(1-naphthyl)-N-phenyl-amino]-biphenyl (hereafter, α-NPD) is widely used. Also used are star burst aromatic amine compounds, including 4,4',4"-tris(N,N-diphenyl-amino)-triphenyl amine (hereafter, TDATA), and 4,4',4"-tris[N-(3-methylphenyl)-N-phenyl-amino]-triphenyl amine (hereafter, MTDATA).

As a material for forming the light-emitting layer 112, host materials and guest materials which have a skeleton common to each other represented by general formulas (1), (9), and (14). For instance, a combination of host materials represented by general formula (5) and guest materials represented by general formula (6) can be used. Preferably, a combination of host materials represented by general formula (7) and guest materials represented by general formula (8), or a combination of host materials represented by general formula (12) and guest materials represented by general formula (13) can be used.

Formula 26

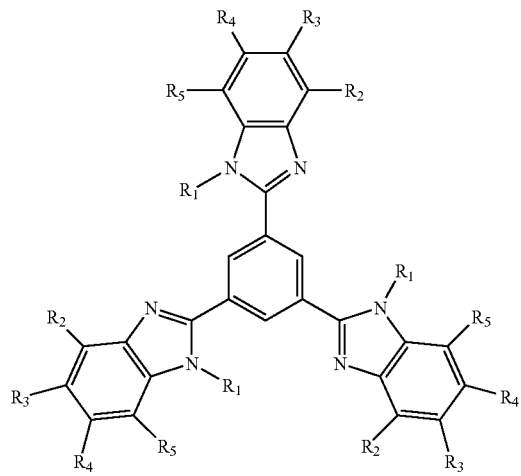
(5)

wherein R1 is a hydrogen atom, a lower alkyl group, an aryl group which may have a substituent, or a heterocyclic group which may have a substituent, and R2 to R5, each of which may be the same or different, are individually a hydrogen atom, a halogen atom, a lower alkyl group, an alkoxy group, an acyl group, a nitro group, a cyano group, an amino group, a dialkylamino group, a diarylamino group, a vinyl group which may have a substituent, an aryl group which may have a substituent, or a heterocyclic group which may have a substituent.

Formula 27

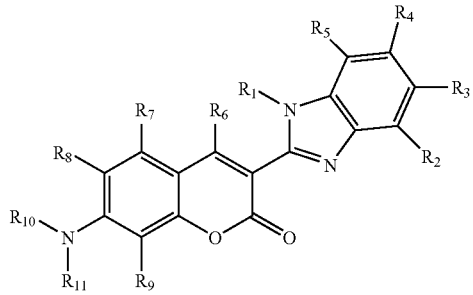
(6)

wherein R1 is a hydrogen atom, a lower alkyl group, an aryl group which may have a substituent, or a heterocyclic group which may have a substituent, R2 to R9, each of which may be the same or different, are individually a hydrogen atom, a halogen atom, a lower alkyl group, an alkoxy group, an acyl group, a nitro group, a cyano group, an amino group, a dialkylamino group, a diarylamino group, a vinyl group which may have a substituent, an aryl group which may have a substituent, or a heterocyclic group which may have a substituent, R10 and R11 are individually a hydrogen atom, a lower alkyl group, an aryl group which may have a substituent, or a heterocyclic group which may have a substituent. R8 and R10, R9 and R11 may be bonded each other to form a substituted or nonsubstituted saturated six-membered ring.

Formula 28

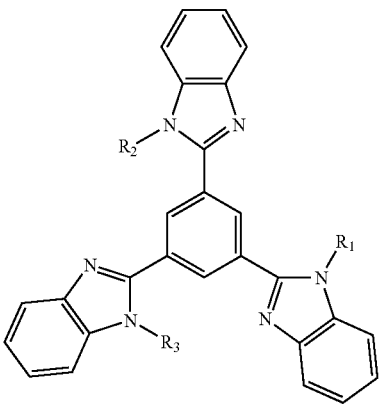
(7)

wherein R1 to R3, each of which may be the same or different, are individually a hydrogen atom, an alkyl group, or an aryl group.

Formula 29

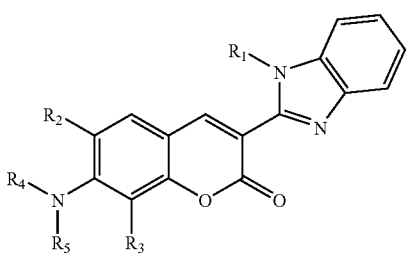
(8)

wherein R1 is a hydrogen atom, a lower alkyl group, an aryl group, or a heterocyclic group, R2 and R3, each of which may be the same or different, are individually a hydrogen atom or a lower alkyl group, and R4 and R5, each of which may be the same or different, are individually a hydrogen atom, a lower alkyl group, an aryl group which may have a substituent, or a heterocyclic group which may have a substituent. R2 and R4, R3 and R5 may be bonded each other to form a substituted or nonsubstituted saturated six-membered ring.

Formula 30

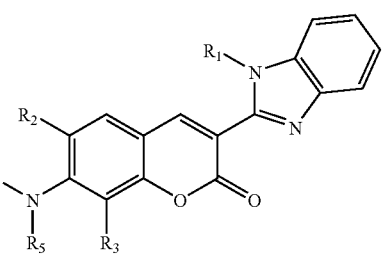
(12)

wherein R1 and R2, each of which may be the same or different, are individually a hydrogen atom, a halogen atom, a lower alkyl group, an alkoxy group, an acyl group, a nitro group, a cyano group, an amino group, a dialkylamino group, a diarylamino group, a vinyl group which may have a substituent, an aryl group which may have a substituent, or a heterocyclic group which may have a substituent.

Formula 31

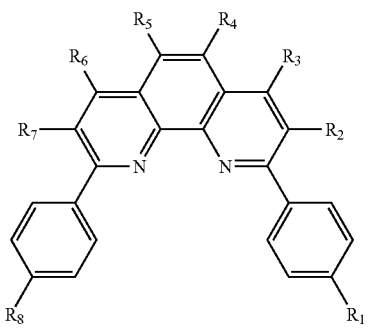

(13)

wherein R1 to R8, each of which may be the same or different, are individually a hydrogen atom, a halogen atom, a lower alkyl group, an alkoxy group, an acyl group, a nitro group, a cyano group, an amino group, a dialkylamino group, a diarylamino group, a vinyl group which may have a substituent, an aryl group which may have a substituent, or a heterocyclic group which may have a substituent.

Embodiment 2

Figure 2:
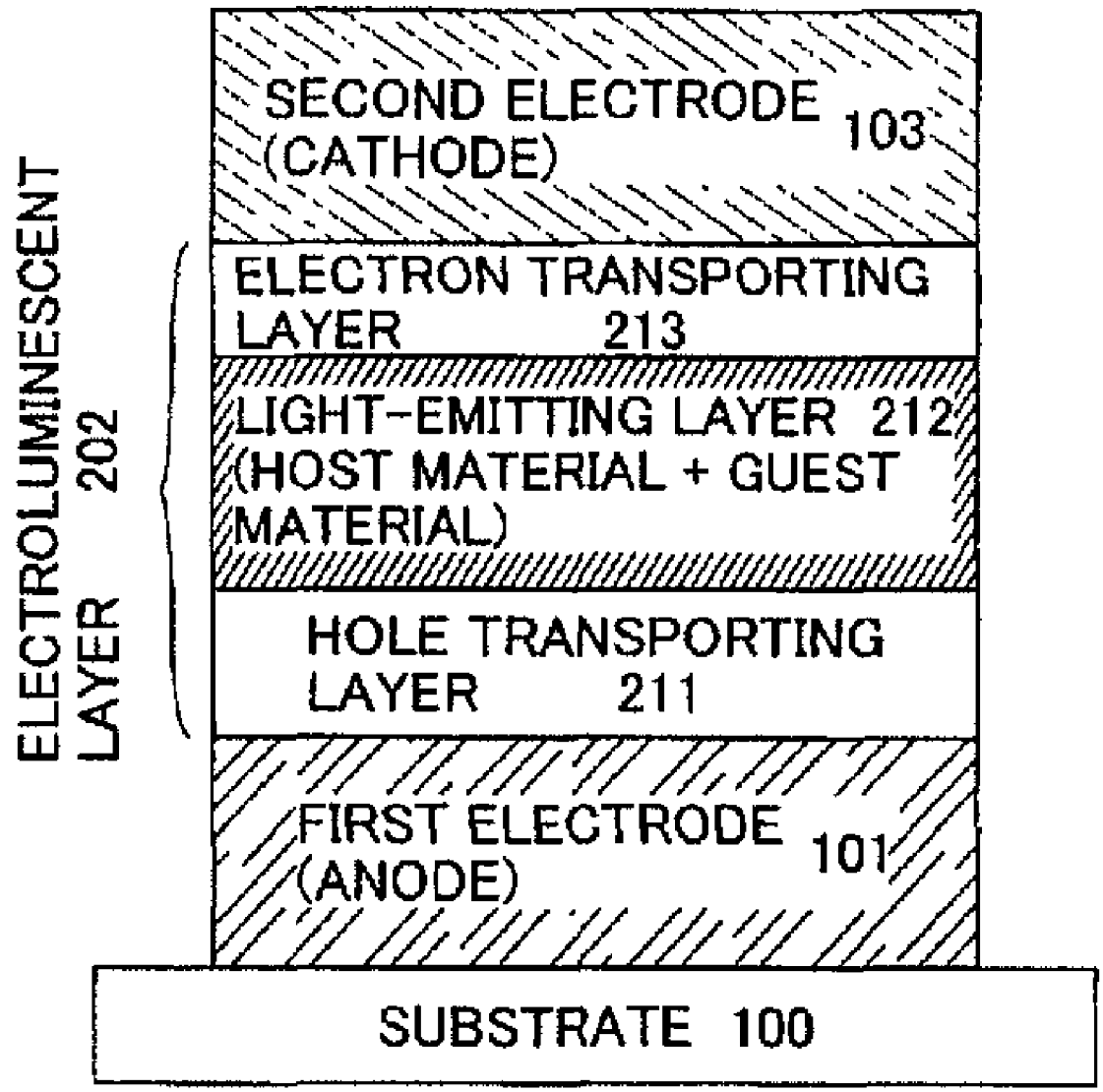
FIG. 2 is an explanatory view for showing a device configuration of an electroluminescent element according to Embodiment 2.

In Embodiment 2, the device configuration of an electroluminescent element incase that an electroluminescent layer has a different lamination structure from that explained in Embodiment 1 will be explained with reference to FIG. 2.

A substrate, a first electrode, and a second electrode are formed by the same material and the same procedure as those described in Embodiment 1. Through this embodiment, like components are denoted by like numerals as of Embodiment 1 and will not be further explained.

An electroluminescent layer 202 according to Embodiment 2 has a lamination structure comprising a hole transporting layer 211, a light-emitting layer 212, and an electron transporting layer 213.

A material for forming the hole transporting layer 211 is the same as that for forming the hole transporting layer 111, and will not be further explained.

A material for forming a light-emitting layer 212 is also the same as that for forming the light-emitting layer 112, and will not be further explained.

As an electron transportation material for forming an electron transporting layer 213, a metal complex having a quinoline skeleton or a benzoquinoline skeleton such as $Alq_3$, $Almq_3$, $BeBq_2$, or a mixed ligand complex such as $Balq_3$ is preferably used. Alternatively, a metal complex having an oxazole or thiazole ligand such as $Zn(BOX)_2$ or $Zn(BTZ)_2$ can be used. Besides, oxadiazole derivatives such as 2-(4-biphenyl)-5-(4-tert-butylphenyl)-1,3,4-oxadiazole (abbreviated PBD), and 1,3-bis[5-(p-tert-butylphenyl)-1,3,4-oxadiazole-2-yl]benzene (hereinafter, OXD-7); triazole derivatives such as 3-(4-tert-butylphenyl)-4-phenyl-5-(4-biphenylyl)-1, 2,4-triazole (hereinafter, TAZ) and 3-(4-tert-butylphenyl)-4-(4-ethylphenyl)-5-(4-biphenylyl)-1,2,4-triazole (hereinafter, p-EtTAZ); and phenanthroline derivatives such as bathophenanthroline (hereinafter, BPhen) and bathocuproin (hereinafter, BCP) can be used in addition to metal complexes.

Embodiment 3

Figure 3:
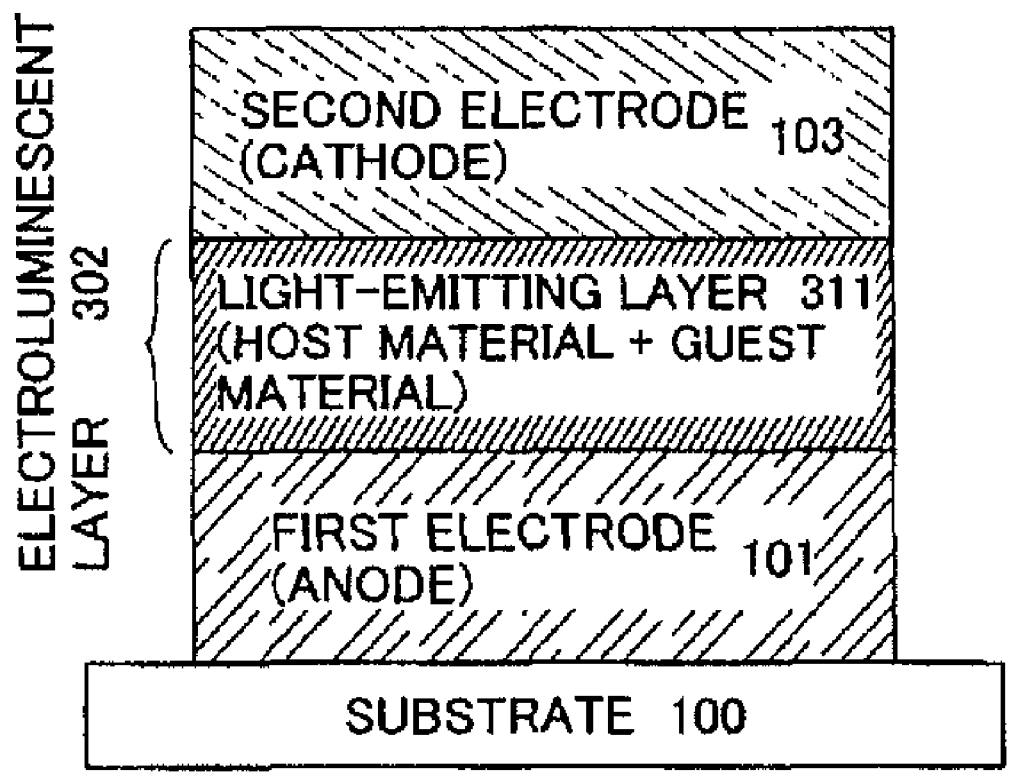
FIG. 3 is an explanatory view for showing a device configuration of an electroluminescent element according to Embodiment 3.

In Embodiment 3, the device configuration of an electroluminescent element in which a sequence of lamination of an electroluminescent layer is different from that descried in Embodiments 1 and 2 will be explained with reference to FIG. 3.

A substrate, a first electrode, and a second electrode are formed by the same material and the same procedure as those described in Embodiment 1. Through this embodiment, like components are denoted by like numerals as of Embodiment 1 and will not be further explained.

An electroluminescent layer 302 has a single layer structure comprising only a light-emitting layer 311.

A light-emitting layer 311 according to Embodiment 3 can be formed by host materials and guest materials which have a skeleton common to each other represented by general formula (14). Preferably, the light-emitting layer 311 can be formed by host materials represented by the following structural formula (15) and guest materials represented by the following formula (16).

Formula 32

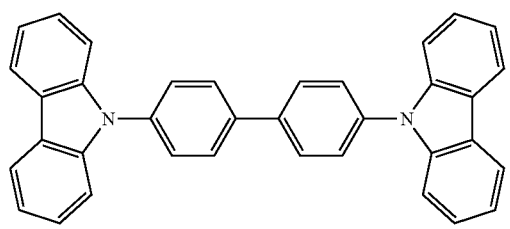

(15)

Formula 33

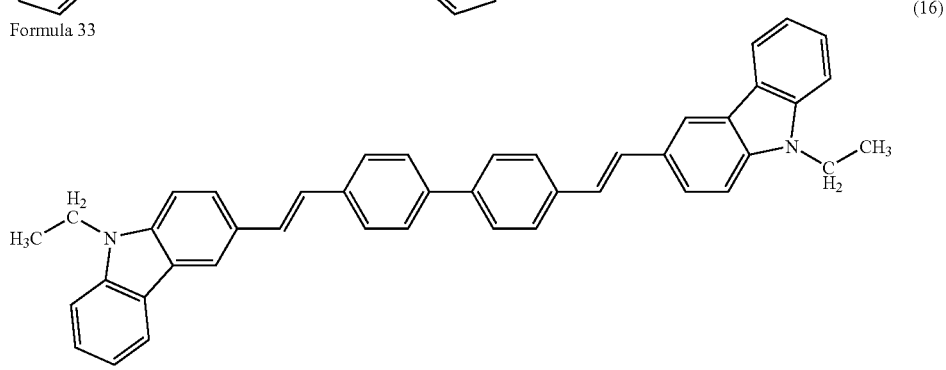

(16)

In Embodiment 3, since an electroluminescent layer 302 comprises only light-emitting layer 311, host materials and guest materials, each of which have both hole transportation properties and electron transportation properties as mentioned above are preferably used.

The structure of the electroluminescent layer described in Embodiments 1 to 3 is not limited to the above mentioned structure, a hole injecting layer, a hole blocking layer, or the like can be appropriately combined therewith.

In this instance, as a hole injection material for forming a hole injecting layer, porphyrin compounds are useful among other organic compounds such as phthalocyanine (hereinafter, $H_2$-Pc), copper phthalocyanine (hereinafter, Cu-Pc), or the like. Further, chemical-doped conductive polymer compounds can be used, such as polyethylene dioxythipophene (hereinafter, PEDOT) doped with polystyrene sulfonate (hereinafter, PSS), polyaniline, polyvinyl carbazole (hereinafter, PVK), or the like.

As a material having hole blocking properties for forming a hole blocking properties, 1,3,4-oxadiazole derivatives such as 2-(4-biphenyl)-5-(4-t-butylphenyl)-1,3,4-oxadiazole (hereinafter, PBD), bathocuproin (abbreviated BCP), 1,2,4-triazole derivatives such as 5-(4-biphenylyl)-3-(4-tert-butylphenyl)-4-phenyl-1,2,4-triazole (hereinafter, TAZ), or the like can be used.

EXAMPLES

Hereinafter, examples according to the present invention will be explained.

Example 1

Figure 4:
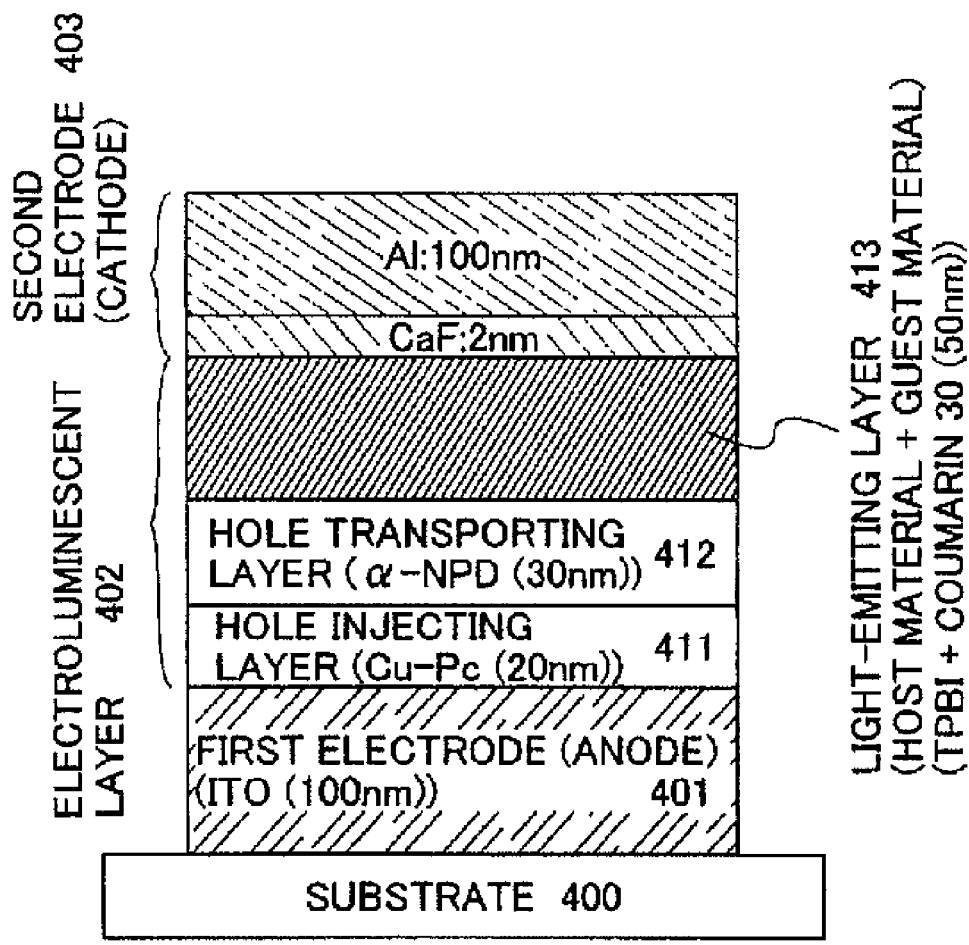
FIG. 4 is an explanatory view for showing a device configuration of an electroluminescent element according to Example 1.

In this example, an electroluminescent element that is formed by using host materials and guest materials which have a skeleton common to each other, for a light-emitting layer, and an electroluminescent layer that has the configuration, as described in Embodiment 1, comprising at least a hole transporting layer and a light-emitting layer will be explained with reference to FIG. 4.

Firstly, a first electrode 401 of an electroluminescent element is formed over substrate 400. In this example, the first electrode serves as an anode. The first electrode 401 is formed by ITO to have a thickness of 110 nm by sputtering.

Secondly, an electroluminescent layer 402 is formed over the first electrode (anode) 401. In this example, the electroluminescent layer 402 has a lamination structure comprising a hole injection layer 411, a hole transporting layer 412, and a light-emitting layer 413. The light-emitting layer 413 is formed by host materials represented by the following structural formula (17) and guest materials represented by the following structural formula (18) as host materials and guest materials which have a common skeleton represented by the general formula (1).

Formula 34

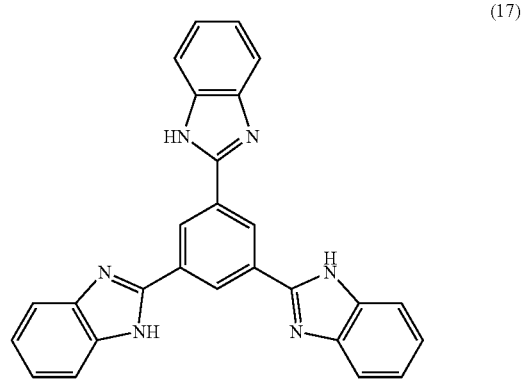

(17)

Formula 35

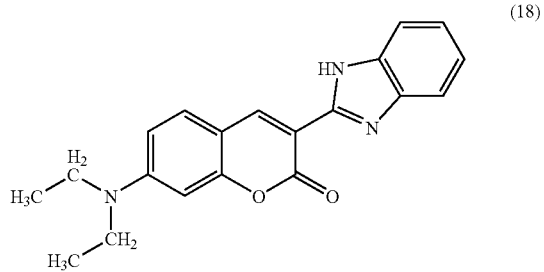

(18)

Further, compounds represented by the following structural formula (19) can be used besides the host material represented by the structural formula (17).

Formula 36

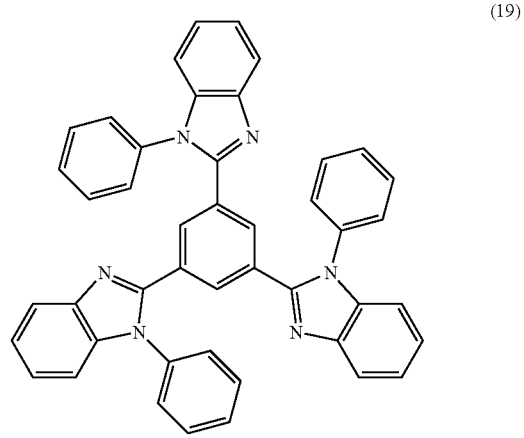

(19)

In addition, compounds represented by the following structural formulas (20) to (22) can be used besides the guest material represented by the structural formula (18).

Formula 37

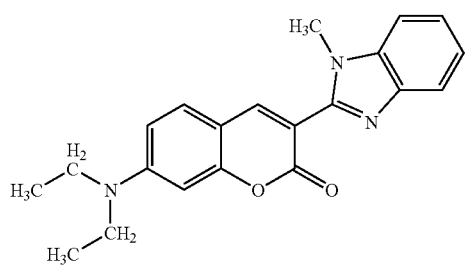
(20)

Formula 38

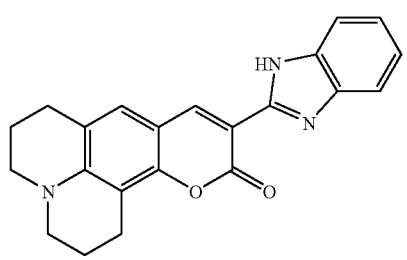
(21)

Formula 39

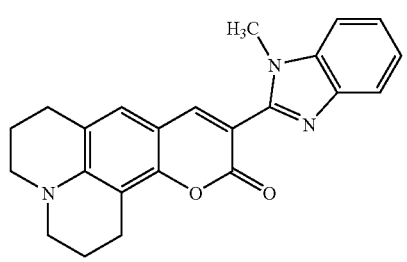
(22)

Besides, the light-emitting layer 413 can be formed by host materials represented by the following structural formula (23) and guest materials represented by the following structural formula (24) as host materials and guest materials which have a common skeleton represented by the general formula (9).

Formula 40

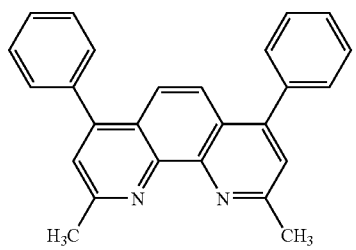
(23)

Formula 41

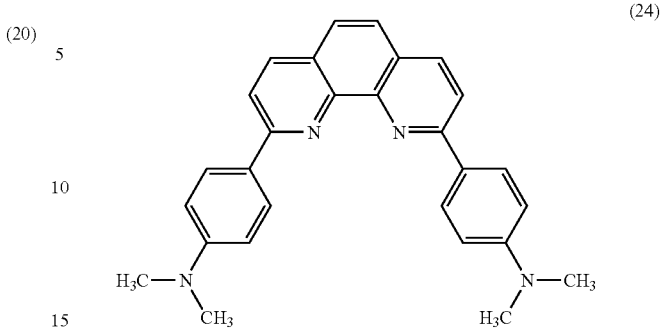
(24)

Further, compounds represented by the following structural formula (25) can be used besides the host material represented by the structural formula (23).

Formula 42

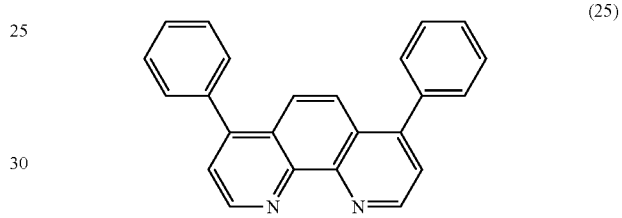
(25)

In addition, compounds represented by the following structural formula (26) can be used besides the guest material represented by the structural formula (24).

Formula 43

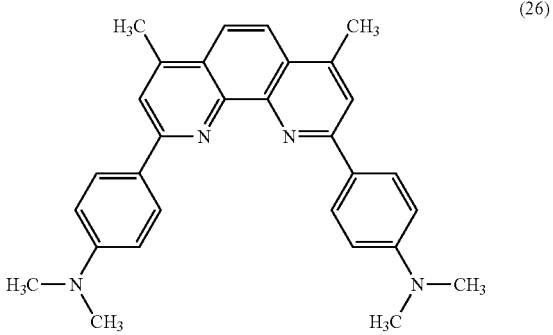
(26)

Besides, the light-emitting layer 413 can be formed by host materials represented by the following structural formula (15) and guest materials represented by the following structural formula (16) as host materials and guest materials which have a common skeleton represented by the general formula (14).

A substrate provided with the first electrode 401 is secured with a substrate holder of a commercial vacuum deposition system in such a way that the surface provided with the first electrode 401 is down. Then, copper phthalocyanine (hereinafter, Cu-Pc) is put into an evaporation source installed in the internal of the vacuum deposition system. And then, the hole injecting layer 411 is formed to have a thickness of 20 nm by vacuum vapor deposition with a resistive heating method.

The hole transporting layer 412 having excellent hole transportation properties is formed by 4,4'-bis[N-(1-naphthyl)-N-phenyl-amino]-biphenyl (hereafter, α-NPD) to have a thickness of 30 nm in accordance with the same procedure as that conducted for forming the hole injection layer 411.

The light-emitting layer 413 is formed, in this example, by the host material represented by the structural formula (17) and the guest material represented by the structural formula (18) by co-evaporation to have a thickness of 20 nm.

A second electrode 403 serving as a cathode is formed. In this example, the second electrode 403 is formed to have a lamination structure by depositing calcium fluoride (CaF) to have a thickness of 2 nm by vapor deposition over the electroluminescent layer 402, and aluminum (Al) is deposited to have a thickness of 100 nm by sputtering thereon.

Accordingly, an electroluminescent element having the light-emitting layer 413 comprising host materials and guest materials which have a skeleton common to each other is formed. The configuration described in Example 1 is a single hetero structure in which the electroluminescent layer 402 comprises the hole transporting layer 412 and the light-emitting layer 413. Since each the host material and the guest material is a compound having common skeletons, the electroluminescent element having excellent carrier transportation properties, and excellent device characteristics such as luminance characteristics and current-voltage characteristics can be formed.

In this example, the case that the first electrode 401 is formed over the substrate by an anode material to serve as an anode is described; however, the present invention is not limited thereto. The first electrode 401 can be formed by a cathode material to serve as a cathode. In this case, that is, in case of exchanging an anode to a cathode, a sequence of lamination of the electroluminescent layer described in this example is reversed. In this example, the first electrode (anode) 401 is a transparent electrode in order to extract light generated in the electroluminescent layer 402 from the first electrode (anode) 401; however, the invention is not limited thereto. If the second electrode (cathode) 403 is formed by a selected material that is suitable for securing transmittance, light can be extracted from the cathode.

Example 2

In this example, an electroluminescent element that is formed by using host materials and guest materials which have a common skeleton for a light-emitting layer, and an electroluminescent layer that has the configuration described in Embodiment 2 comprising at least a hole transporting layer, a light-emitting layer, and an electron transporting layer will be explained with reference to FIG. 5.

A configuration in Example 2 is similar to that described in Example 1. The configuration in Example 2 is distinguished from that in Example 1 by the fact that an electroluminescent layer 502 comprises at least an electron transporting layer 514.

Figure 5:
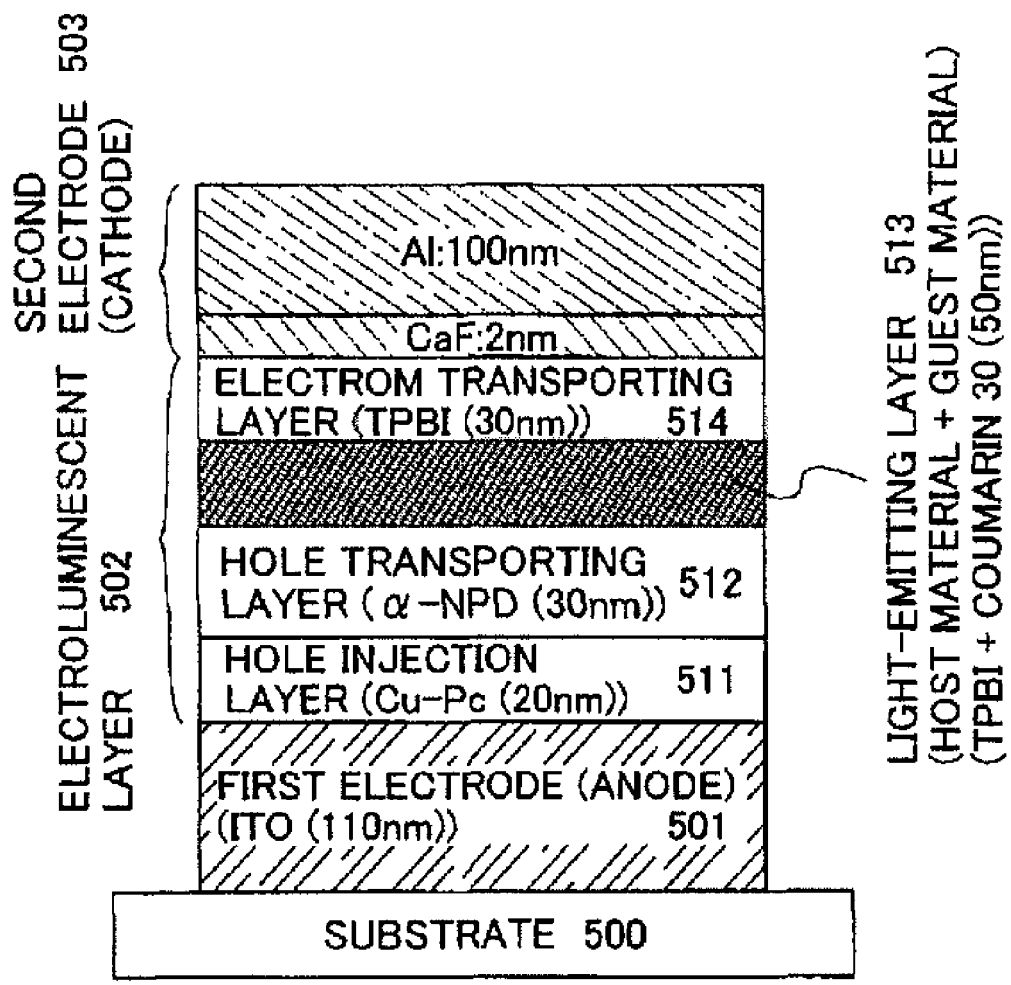
FIG. 5 is an explanatory view for showing a device configuration of an electroluminescent element according to Example 2.

That is, a first electrode 501, a hole injection layer 511, a hole transporting layer 512, a light-emitting layer 513, and a second electrode 503 can be formed by the same materials as those used in Example 1 to have the same thicknesses as those of the configuration described in Example 1 as shown in FIG. 5.

The electron transporting layer 514 is formed by vapor deposition to have a thickness of 20 nm by the compound represented by the structural formula 19 that is used as the host material for the light-emitting layer 513. Further, the carrier transportation properties can be improved by using the same compounds for both the light-emitting layer 513 and the electron transporting layer 514.

The configuration described in Example 2 has a double hetero structure that is unlike in the case of Example 1 explaining a single hetero structure.

Example 3

In this example, an electroluminescent element that is formed by using host materials and guest materials which have a common skeleton for a light-emitting layer, and an electroluminescent layer that has the configuration described in Embodiment 3 comprising at least a light-emitting layer will be explained with reference to FIG. 6.

A configuration in Example 3 is distinguished from those in Examples 1 and 2 by the fact that an electroluminescent layer comprises at least a light-emitting layer 613.

Figure 6:
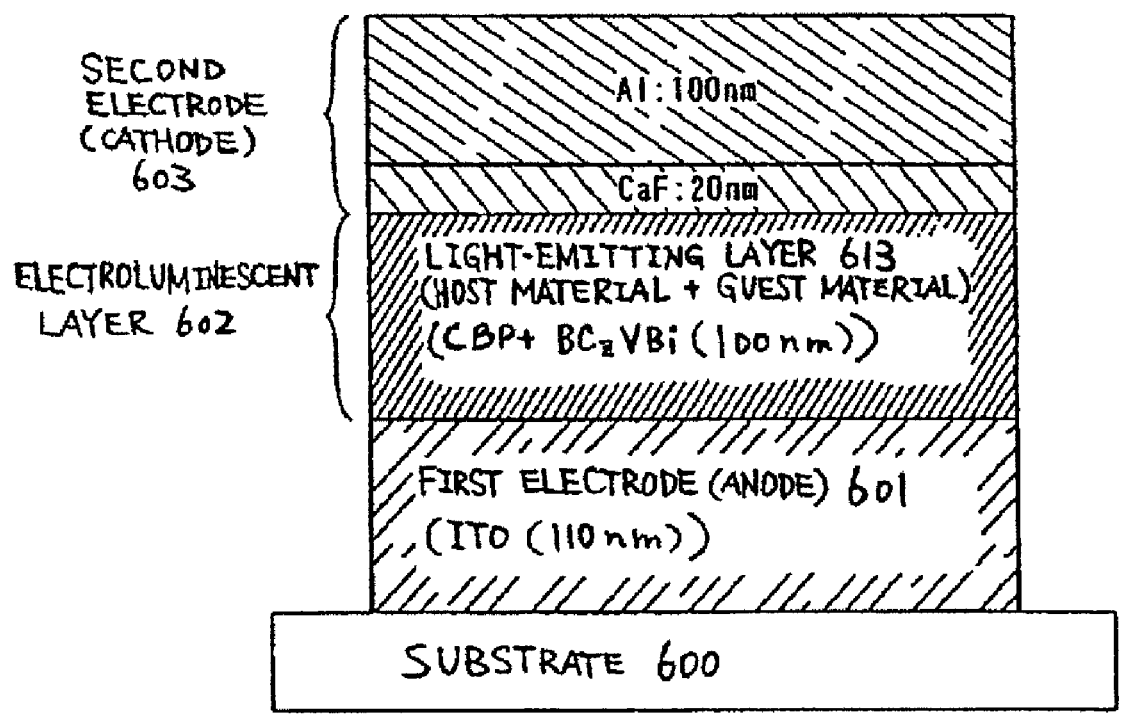
FIG. 6 is an explanatory view for showing a device configuration of an electroluminescent element according to Example 3

A first electrode 601 and a second electrode 603, which are formed over a substrate 600, can be formed by the same materials as those used in Example 1 to have the same thicknesses as those of the configuration described in Example 1 as shown in FIG. 6.

In case of this example, the light-emitting layer 613 is required to be formed by a material having hole transportation properties and electron transportation properties since the electroluminescent layer is composed of only the light-emitting layer 613. Specifically, the host material and the guest material which have a common skeleton represented by the general formula (14) can be used as the light-emitting layer 613. For instance, the host material (CBP) represented by the structural formula (15) and the guest material (BCzVBi) represented by the structural formula (16) are dispersed into solvent (dichloroethane, or the like) in 1:0.3 molar ratio to be coated for forming the light-emitting layer 613.

As noted above, the electroluminescent layer 602 according to this example is formed.

Example 4

In this example, an electroluminescent element which has the device configuration described in Example 2: ITO/Cu-Pc (20 nm)/α-NPD (30 nm)/TPBI+coumarin 30 (30 nm)/TPBI (30 nm)/CaF (2 nm)/Al was manufactured. Then, the device characteristics of the electroluminescent device were measured. The size of an electrode formed by ITO is 2-mm-square. The electroluminescent element exhibits blue emission having an emission spectrum with maximum intensity at 475 nm, CIE (x, y)=(0.152, 0.302) in a wavelength region.

Figure 7:
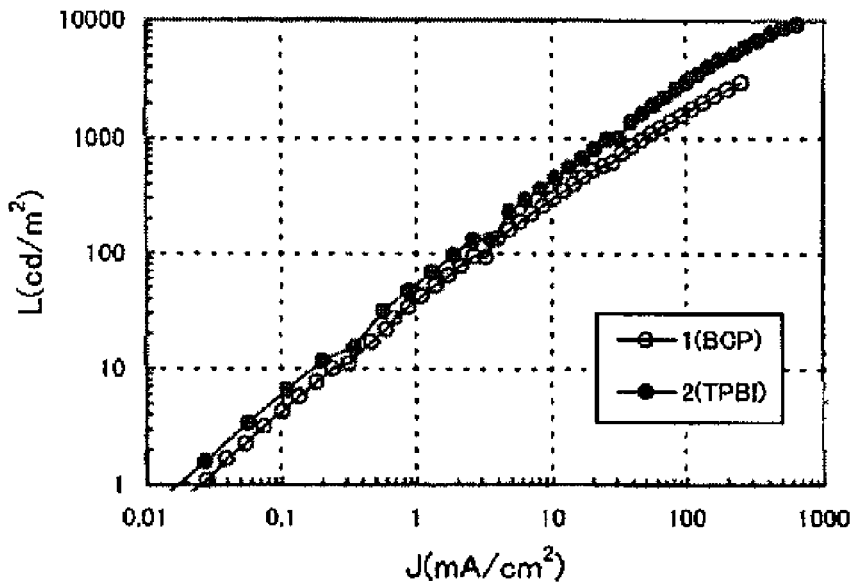
FIG. 7 is a graph showing device characteristics of an electroluminescent element.

Each plot 2 in FIGS. 7 to 10 shows the measurement results. The luminance-current characteristics plot 2 in FIG. 7 shows that a luminance of approximately 3100 cd/m$^2$ is obtained at a current density of 100 mA/cm$^2$.

Figure 8:
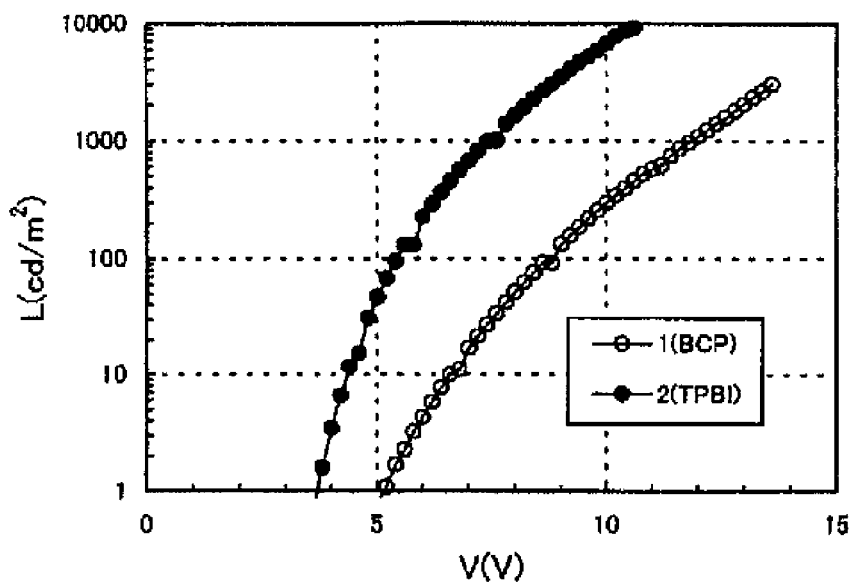
FIG. 8 is a graph showing device characteristics of an electroluminescent element.

The luminance-voltage characteristics plot 2 in FIG. 8 shows that a luminance of approximately 1600 cd/m$^2$ is obtained at an applied voltage of 8 V.

Figure 9:
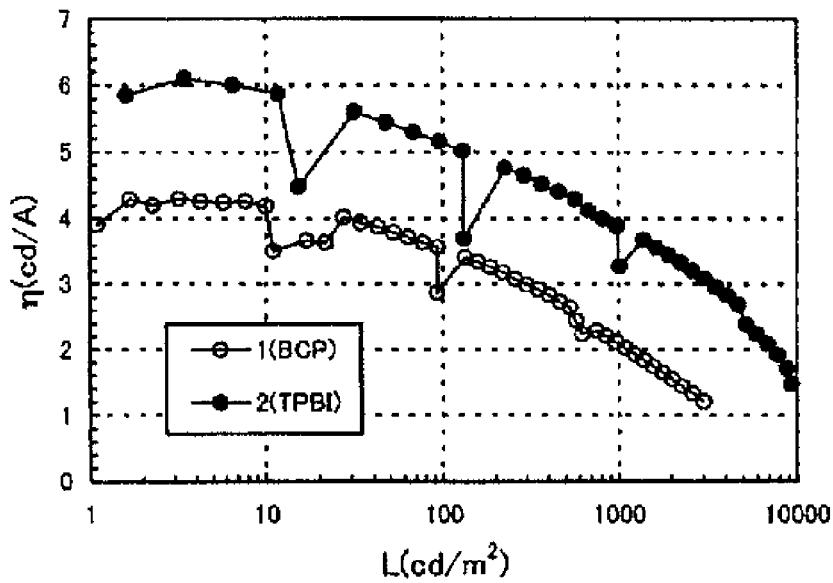
FIG. 9 is a graph showing device characteristics of an electroluminescent element.

The current efficiency-luminance characteristics plot 2 in FIG. 9 shows that a current efficiency is approximately 5.1 cd/A at a luminance of approximately 100 cd/m$^2$.

Figure 10:
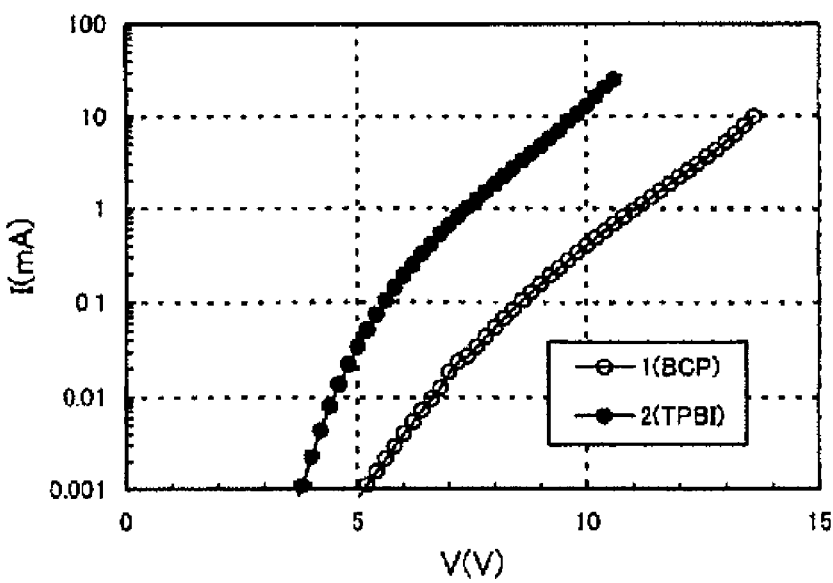
FIG. 10 is a graph showing device characteristics of an electroluminescent element.

The current-voltage characteristics plot 2 in FIG. 10 shows that a current flow is approximately 0.66 mA at an applied voltage of 7 V.

Comparative Example 1

On the other hand, an electroluminescent element in which bathocuproin (hereinafter, BCP), which has been used as host materials for an electroluminescent element, is used for forming an electron transporting layer, and as host materials for an electroluminescent layer was measured. The electroluminescent element has the device configuration: ITO/Cu-Pc (20 nm)/α-NPD (30 nm)/BCP+coumarin 30 (30 nm)/BCP (30 nm)/CaF (2 nm)/Al. Each plot 1 in FIGS. 7 to 10 shows the measurement results. The luminance-current characteristics plot 1 in FIG. 7 shows that a luminance of approximately 1800 cd/m$^2$ is obtained at a current density of 100 mA.

The luminance-voltage characteristics plot 1 in FIG. 8 shows that a luminance of approximately 50 cd/m$^2$ is obtained at an applied voltage of 8 V. The result provides the fact that the luminance to an applied voltage is significantly decreased compared with that of the device configuration shown in Example 2.

The current efficiency-luminance characteristics plot 1 in FIG. 9 shows that a current efficiency is approximately 3.5 cd/A at a luminance of approximately 100 cd/cm$^2$. Also in this case the current efficiency is worse than that represented by plot 2 of the device configuration shown in Example 2.

The current-voltage characteristics plot 1 in FIG. 10 shows that current flow is only approximately 0.02 mA at an applied voltage of 7 V.

From the comparative results described above, the device configuration can be improved by forming the electroluminescent element using host materials and guest materials which have a common skeleton according to the invention.

Example 5

Figure 11A:
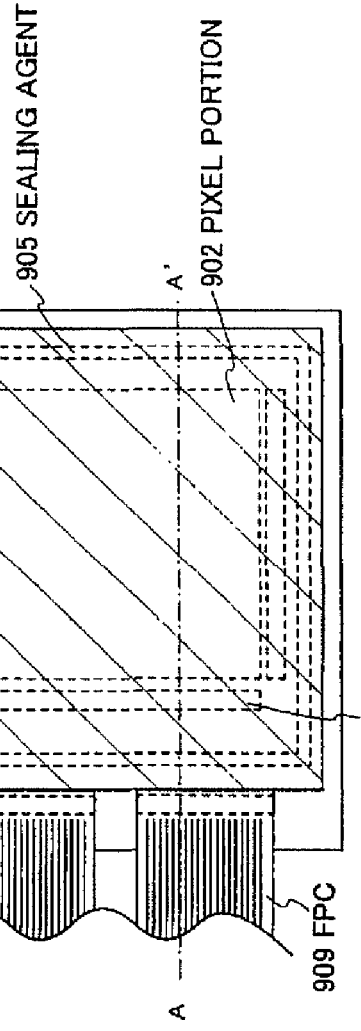
FIGS. 11A and 11B are explanatory views for showing a light-emitting device.
Figure 11B:
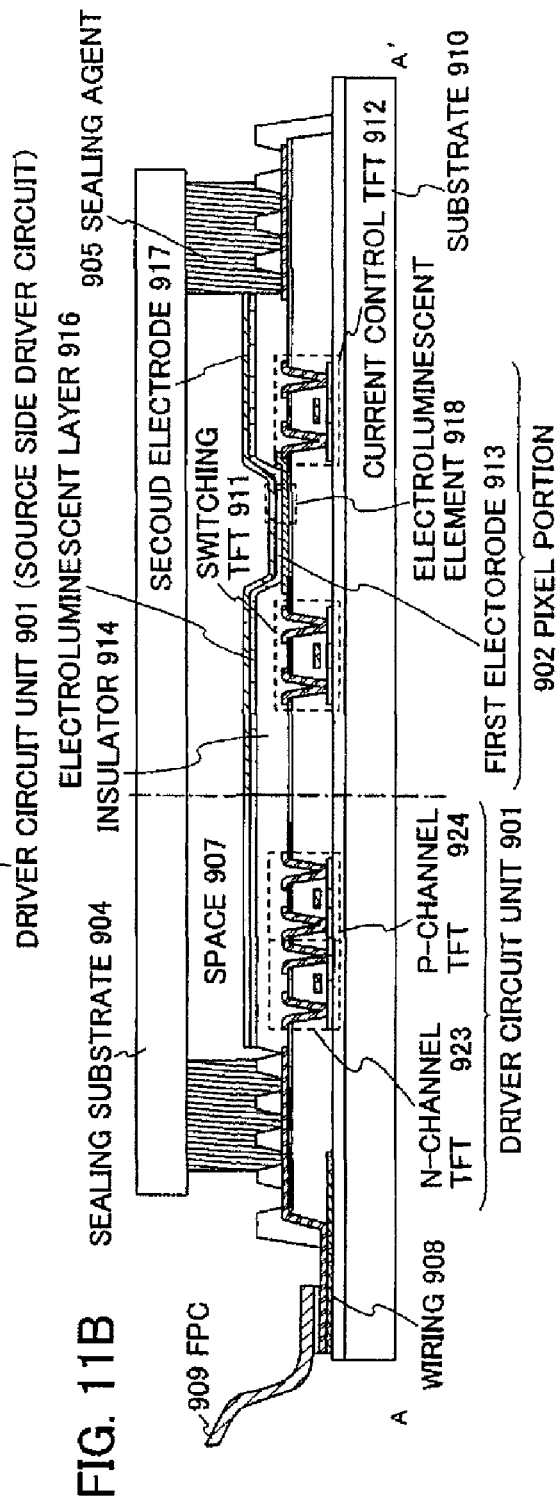

In this example, a light-emitting device having an electroluminescent element according to the present invention in a pixel portion will be explained with reference to FIG. 11. FIG. 11A is a top view of a light-emitting device. FIG. 11B is a cross-sectional view of FIG. 11A taken along the line A-A'. Reference numeral 901 by a dotted line denotes a driver circuit unit (a source side driver circuit); reference numeral 902 denotes a pixel portion; 903, a driver circuit unit (a gate side driver circuit); 904, a sealing substrate; and 905, sealing agent. The inside portion surrounded by the sealing agent 905 is space 907.

Reference 908 denotes a wiring for transmitting signals inputted to the source signal line driver circuit 901 and the gate signal line driver circuit 903. The wiring receives video signals, clock signals, start signals, or reset signals from an FPC (flexible printed circuit) 909 serving as an external input terminal. Although only FPC is illustrated in the drawing, a PWB (printed wirings board) may be attached to the FPC. As used in this specification, the term "light-emitting device" refers to not only a main body of a light-emitting device but also the main body provided with the FPC 909 or PWB.

Then, a cross-sectional structure will be explained with reference to FIG. 11B. A driver circuit and a pixel portion are formed over a substrate 910. In FIG. 11B, the source side driver circuit 901 as a driver circuit unit and the pixel portion 902 are illustrated.

The source signal line driver circuit 901 is provided with a CMOS circuit formed by combining an n-channel TFT 923 and a p-channel TFT 924. A TFT for forming a driver circuit may be formed by a known CMOS, PMOS, or NMOS circuit. In this example, a driver integrated type in which a driver circuit is formed over a substrate is described, but not exclusively, the driver circuit can be formed outside instead of over a substrate.

The pixel portion 902 is composed of a plurality of pixels including a switching TFT 911, a current control TFT 912, and a first electrode 913 connected electrically to the drain of the current control TFT 912. Further, an insulator 914 is formed to cover the edge of the first electrode 913. Here, the insulator 914 is formed by a positive type photosensitive acrylic resin film.

In order to make favorable coverage, an upper edge portion and a lower edge portion of the insulator 914 are formed to have a curved face having a radius of curvature. For example, positive type photosensitive acrylic is used as a material for the insulator 914, only upper edge portion of the insulator 914 is preferably having a radius of curvature (from 0.2 to 3 µm). As the insulator 914, either a negative type photosensitive resin that becomes insoluble to etchant by light or a positive type photosensitive resin that becomes dissoluble to etchant by light can be used.

An electroluminescent layer 916 and a second electrode 917 are formed over the first electrode 913, respectively. As a material for the first electrode 913 serving as an anode, a material having a large work function is preferably used. For instance, the first electrode can be formed by a single layer such as an ITO (indium tin oxide) film, an IZO (indium zinc oxide) film, a titanium nitride film, a chromic film, a tungsten film, a Zn film, or a Pt film; a lamination layer comprising one of the above single layer and a film containing mainly titanium nitride and aluminum; a three lamination layer comprising a titanium film, a film containing aluminum as its main components, and a titanium nitride; or the like. In case of adopting the lamination layer, the first electrode can be formed to have a low resistance as a wiring, and make good ohmic contact, and serve as an anode.

The electroluminescent layer 916 is formed by vapor deposition using an evaporation mask or ink jetting. The electroluminescent layer 916 contains host materials and guest materials which have a common skeleton. As a material for using together with the host material and the guest material, either small molecular materials or high molecular materials can be used. In addition, as a material for an electroluminescent layer, a single layer or a lamination layer formed by an organic compound is generally used. However, the invention comprehends the case that a part of a film formed by an organic compound includes an inorganic compound.

As a material for the second electrode (cathode) 917 formed over the electroluminescent layer 916, a material having a small work function (Al, Ag, Li, Ca, or alloys of these elements such as MgAg, MgIn, AlLi, CaF$_2$, or CaN) can be used. In case of extracting light generated in the electroluminescent layer 916 from the second electrode (cathode) 917, the second electrode (cathode) 917 is preferably formed by a lamination layer comprising a thin metal film and a transparent conductive film (alloys such as indium tin oxide (ITO), indium zinc oxide (In$_2$O$_3$—ZnO), zinc oxide (ZnO), or the like).

The sealing substrate 904 is pasted onto the substrate 910 with the sealing agent 905 to encapsulate an electroluminescent element 918 within the space 907 surrounded by the substrate 910, the sealing substrate 904, and the sealing agent 905. The invention comprehends not only the case that the space 907 is filled with inert gases (such as nitrogen or argon) but also the case that the space 907 is filled with the sealing agent 905.

The sealing agent 905 is preferably formed by epoxy-based resin. In addition, it is desirable that the material for the sealing agent inhibits the penetration of moisture or oxygen. As a material for the sealing substrate 904, a plastic substrate such as FRP (fiberglass-reinforced plastics), PVF (poly(vinyl fluoride), Myler, polyester, or acrylic can be used besides a glass substrate or a quartz substrate.

Accordingly, a light-emitting device having an electroluminescent element according to the invention can be obtained.

The light-emitting device described in this example can be practiced by combining freely with the configuration of the electroluminescent element explained in Examples 1 to 3.

Example 6

Various electric appliances completed by using a light-emitting device having an electroluminescent element according to the present invention will be explained in this example.

Given as examples of such electric appliances manufactured by using a light-emitting device having the electroluminescent element according to the invention: a video camera, a digital camera, a goggles-type display (head mount display), a navigation system, a sound reproduction device (a car audio equipment, an audio set and the like), a laptop personal computer, a game machine, a portable information terminal (a mobile computer, a cellular phone, a portable game machine, an electronic book, or the like), an image reproduction device including a recording medium (more specifically, a device which can reproduce a recording medium such as a digital versatile disc (DVD) and so forth, and includes a display for displaying the reproduced image), or the like. FIGS. 12A to 12G show various specific examples of such electric appliances.

Figure 12A:
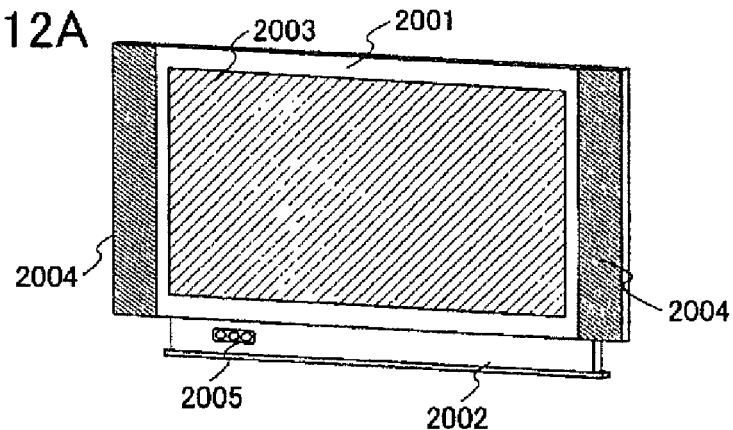
FIGS. 12A to 12G are explanatory views for showing electric appliances.

FIG. 12A illustrates a display device which includes a frame 2001, a support table 2002, a display portion 2003, a speaker portion 2004, a video input terminal 2005, or the like. The light-emitting device having the electroluminescent element according to the invention can be used for the display portion 2003. The display device is including all of the display devices for displaying information, such as a personal computer, a receiver of TV broadcasting, and an advertising display.

Figure 12B:
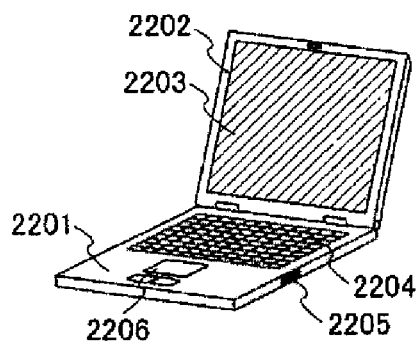

FIG. 12B illustrates a laptop computer which includes a main body 2201, a casing 2202, a display portion 2203, a keyboard 2204, an external connection port 2205, a pointing mouse 2206, or the like. The light-emitting device having the electroluminescent element according to the invention can be used to the display portion 2203.

Figure 12C:
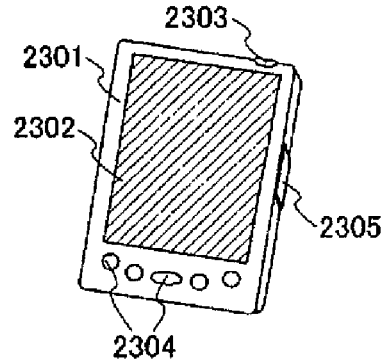

FIG. 12C illustrates a mobile computer which includes a main body 2301, a display portion 2302, a switch 2303, an operation key 2304, an infrared port 2305, or the like. The light-emitting device having the electroluminescent element according to the invention can be used to the display portion 2302.

Figure 12D:
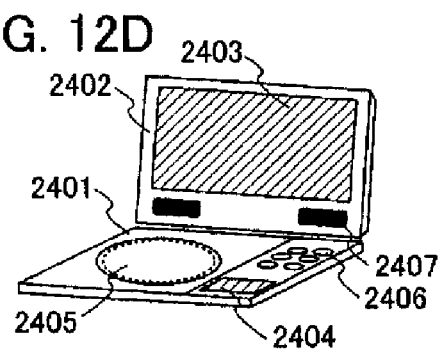

FIG. 12D illustrates an image reproduction device including a recording medium (more specifically, a DVD reproduction device), which includes a main body 2401, a casing 2402, a display portion A 2403, another display portion B 2404, a recording medium (DVD or the like) reading portion 2405, an operation key 2406, a speaker portion 2407, or the like. The display portion A 2403 is used mainly for displaying image information, while the display portion B 2404 is used mainly for displaying character information. The light-emitting device having the electroluminescent element according to the invention can be used to the display portion A 2403 and the display portion B 2404. Note that the image reproduction device with a recording medium further includes a domestic game machine or the like.

Figure 12E:
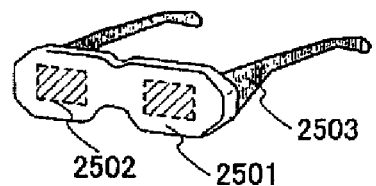

FIG. 12E illustrates a goggle type display (head mounted display), which includes a main body 2501, a display portion 2502, and an arm portion 2503. The light-emitting device having the electroluminescent element according to the invention can be used to the display portion 2502.

Figure 12F:
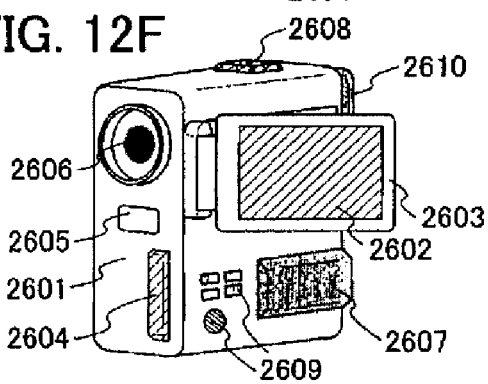

FIG. 12F illustrates a video camera which includes a main body 2601, a display portion 2602, an casing 2603, an external connecting port 2604, a remote control receiving portion 2605, an image receiving portion 2606, a battery 2607, a sound input portion 2608, an operation key 2609, an eyepiece portion 2610, or the like. The light-emitting device having the electroluminescent element according to the invention can be used to the display portion 2602.

Figure 12G:
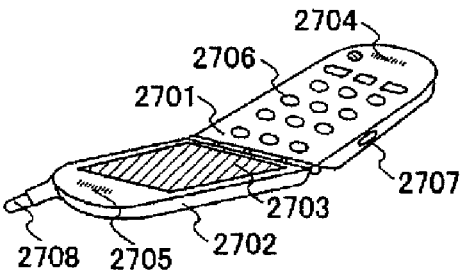

FIG. 12G illustrates a cellular phone which includes a main body 2701, a casing 2702, a display portion 2703, a sound input portion 2704, a sound output portion 2705, an operation key 2706, an external connecting port 2707, an antenna 2708, or the like. The light-emitting device having the electroluminescent element according to the invention can be used to the display portion 2703.

As set forth above, the light-emitting device having the electroluminescent element according to the invention can be applied variously to a wide range of electric appliances in all fields. By applying the light-emitting device to electric appliances in various fields', low power consumption and long lifetime can be achieved.

An electroluminescent element that is superior in device characteristics such as emission efficiency, luminous characteristics, or the like, to the conventional electroluminescent element by manufacturing in such a way that a part of an electroluminescent layer is formed by host materials and guest materials which have a common skeleton.

What is claimed is:
1. An electroluminescent element comprising:
a pair of electrodes; and
an electroluminescent layer comprising a host material and a guest material and provided between the pair of electrodes,
wherein each of the host material and the guest material is a compound having a skeleton represented by the general formula (14),

(14)

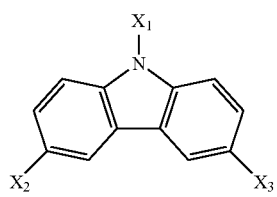

wherein $X_1$ and $X_2$ are individually a hydrogen atom, a halogen atom, an alkoxy group, an acyl group, a nitro group, a cyano group, an amino group, a dialkylamino group, a diarylamino group, a substituted or unsubstituted aryl group, or a substituted or unsubstituted heterocyclic group, wherein $X_3$ is a hydrogen atom, wherein the host material does not comprise the following structural formula (15), and (15)

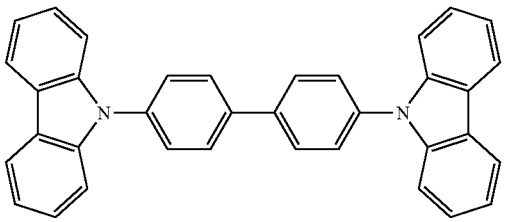

wherein the guest material does not comprise the following structural formula (16)

(16)

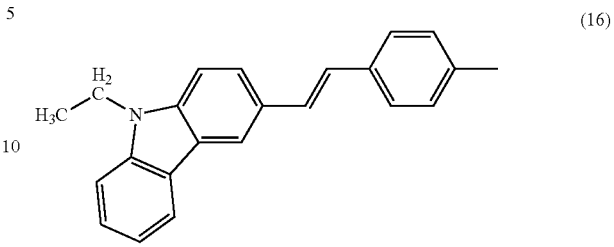

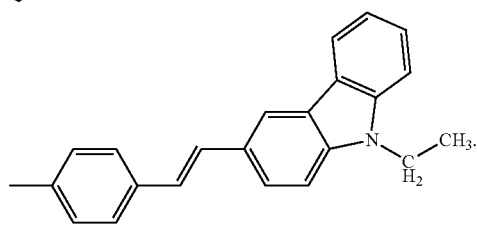

2. The electroluminescent element according to claim 1, wherein each of the host material and the guest material has both hole transportation property and electron transportation property.

* * * * *